United States Patent [19]

Nelson

[11] Patent Number: 5,523,193
[45] Date of Patent: Jun. 4, 1996

[54] METHOD AND APPARATUS FOR PATTERNING AND IMAGING MEMBER

[75] Inventor: William E. Nelson, Dallas, Tex.

[73] Assignee: Texas Instruments Incorporated, Dallas, Tex.

[21] Appl. No.: 361,007

[22] Filed: Dec. 21, 1994

Related U.S. Application Data

[63] Continuation of Ser. No. 20,891, Feb. 22, 1993, abandoned, which is a continuation of Ser. No. 730,511, Jul. 11, 1991, abandoned, which is a continuation of Ser. No. 453,022, Dec. 20, 1989, abandoned, which is a continuation of Ser. No. 200,389, May 31, 1988, abandoned.

[51] Int. Cl.$^6$ ............................................. G03F 7/20
[52] U.S. Cl. ...................... 430/311; 430/20; 346/107.1; 347/134; 358/300
[58] Field of Search ...................... 430/20, 311; 346/160, 346/107 R, 107.1; 350/338, 607, 608; 358/236, 300; 347/134

[56] References Cited

U.S. PATENT DOCUMENTS

| | | | |
|---|---|---|---|
| 4,793,699 | 12/1988 | Tokuhara | 350/487 |
| 4,799,770 | 1/1989 | Kahn et al. | 350/331 R |
| 4,818,098 | 4/1989 | Kahn et al. | 353/122 |
| 4,888,616 | 12/1989 | Nanamura et al. | 355/202 |
| 5,150,250 | 9/1992 | Setani | 359/221 |

FOREIGN PATENT DOCUMENTS

| | | |
|---|---|---|
| 0155844 | 3/1987 | European Pat. Off. . |
| 9003621 | 4/1990 | Germany . |
| 212843 | 9/1986 | Japan ........... 430/20 |
| 62-075671 | 4/1987 | Japan . |

*Primary Examiner*—Kathleen Duda
*Attorney, Agent, or Firm*—Brain C. McCormack; James C. Kesterson; Richard L. Donaldson

[57] ABSTRACT

A device (40) for patterning an imaging member (46) is provided. The device (40) comprises a light source (42) which emits light rays (44). Light rays (44) pass through a collimator (45) to collimate the light rays (48). The light then strikes a spatial light modulator (50) which is controlled by a computer (52) to reflect the light (54). The light passes through an imaging member (56) to demagnify the pattern for striking imaging member (46). Imaging member (46) is thus patterned by changing modulator (50) by computer (52).

19 Claims, 2 Drawing Sheets

METHOD AND APPARATUS FOR PATTERNING AND IMAGING MEMBER

This application is a Continuation of application Ser. No. 08/020,891 filed Feb. 22, 1993 abandoned; which is a continuation of application Ser. No. 07/730,511, filed Jul. 11, 1991 abandoned; which is a Continuation of application Ser. No. 07/453,022, filed Dec. 20, 1989, abandoned; which is a continuation of application Ser. No. 07/200,389, filed May 31, 1988; abandoned.

TECHNICAL FIELD OF THE INVENTION

This invention relates in general to techniques for forming integrated circuits, and in particular to a method and apparatus for patterning an integrated circuit on an imaging member with a spatial light modulator.

BACKGROUND OF THE INVENTION

The semiconductor industry is becoming highly specialized in the design of semiconductor devices. Customers are designing specific applications for integrated circuits such as, for example, for sensing temperature and fuel flow in an automobile to improve fuel economy. Typically, these application specific integrated circuits (ASIC) are complex to manufacture and therefore expensive in small volumes.

A common method of fabricating integrated circuit devices requires the use of a mask or reticle to photo-optically transfer a pattern of a structure to a semiconductor wafer. The structure is formed by patterning a layer of photoresist on the semiconductor surface which is then etched to form the structure. An example of a photo-optical device used to transfer the reticle pattern to a semiconductor wafer is commonly termed a stepper, after the step-and-repeat exposure process utilized.

Under present manufacturing techniques, the pattern for a specific integrated circuit is copied onto a computerized master tape. The master tape is then used to create a set of reticles for the lithographic process. A set of reticles is typically created with a complex, extremely expensive piece of equipment known as an Electron Beam Vertical Generator. A set of reticles must be created due to the various levels of structures on semiconductor devices, each of which requires at least one separate reticle. Reticles cost several thousand dollars, so if there are, for example, fifteen layers on a particular design, the cost for reticles alone can be very expensive, and the time to fabricate and inspect them can be lengthy.

After the reticles are created, they are sent to a fabrication area which uses a device such as the stepper to create the specific integrated circuit level by level. A reticle is placed into the Stepper and a photoresist coated wafer is exposed to a light source through the reticle. The exposure process then permits the subsequent development of the photoresist to form the desired pattern therein. The slice is then etched to produce a structure corresponding to the pattern.

After each structure is etched, an operator usually inspects the slice for deficiencies. If a deficiency is discovered, the entire slice may be lost, the reticle must be replaced and the entire process started over. Thus, if an error is not detected until the final layer, the fabrication expense which has incurred is wasted.

This process is both expensive and time consuming. The turn-around time for the creation of a master set of reticles and the fabrication of specific integrated circuits may be from weeks to months. The total cost for creating a specific integrated circuit is thus a barrier to many potential users.

Thus, there is a need for a method and apparatus for the fabrication of specific integrated circuits at a lower cost with a shorter turn-around time.

SUMMARY OF THE INVENTION

The present invention disclosed herein comprises a method and apparatus for patterning an imaging member which substantially eliminates or reduces problems associated with prior patterning methods and devices. The present invention allows the patterning of an imaging member without the time consuming creation of an expensive set of reticles, and without resorting to direct slice write procedures using electron beam pattern generation.

In accordance with one aspect of the invention, an apparatus for patterning an imaging member is provided. An array of electronically programmable pixels on a semiconductor chip is illuminated by a light source. An optical system focuses light from the source onto the array which is programmed by an electronic controller. Light is reflected from the modulated array through an optical imager which focuses the light onto the imaging member to create the programmed pattern in a light sensitive layer.

In another aspect of the present invention, the array comprises a linear or an area array. The imaging member comprises a semiconductor surface coated with photoresist, and the light source is ultraviolet. Alternatively, the imaging member may comprise a photothermal plastic surface and the light source may be infrared.

It is a technical advantage of the present invention that a specific integrated circuit may be formed in a shorter period of time at a lower cost by eliminating the need for a master set of reticles. More than one type of device may be formed on a single wafer at no additional expense.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 5b is a cross-sectional view of the pixel of FIG. 5a; and

DETAILED DESCRIPTION OF THE INVENTION

Figure 1:
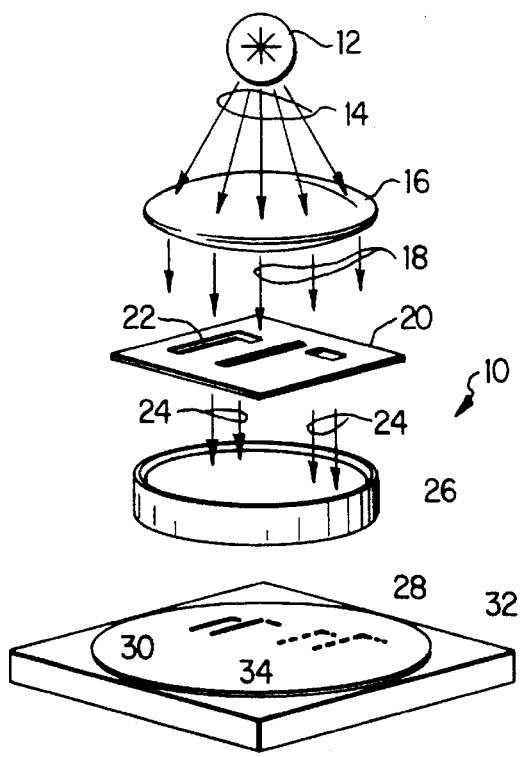
FIG. 1 is a perspective view of a prior art Stepper.

Referring to FIG. 1, an apparatus commonly termed a stepper is constructed in accordance with the prior art for patterning semiconductor devices and is generally identified by the reference numeral 10. The apparatus 10 comprises a light source 12 having a wave length suitable to expose organic photoresist. Light rays, as indicated by arrows 14, are emitted from the light source 12 in all directions.

Appropriate optics are provided by collimator 16 to collimate the light rays 14 as indicated by arrows 18.

The collimated light 18 passes through a reticle 20 which has been uniquely patterned by any appropriate device such as, for example, an Electron Beam Vertical Generator as is well known in the art. The reticle 20 typically comprises a coated glass plate having patterned openings 22 therein to allow the collimated light 18 to pass therethrough. The light, as indicated by arrows 24, which passes through reticle 20 corresponds to the desired pattern. The light 24 strikes an optical imager 26 which demagnifies the image from the reticle 20 and transfers the image to the wafer slice 28 as indicated by chip 30. The wafer 28 is coated with photoresist which is sensitive to the wave length of light emitted from the light source 12.

The wafer slice 28 is carried by a platform 32 which is capable of precise movements in all directions to allow shifting of the slice 28 to a next position for exposure of additional chips as indicated by dashed lines 34.

As an example, a reticle pattern may be ten centimeters (cm) square, whereas the desired pattern size on the slice may be one cm square. Thus, the collimator optics and the imager optics must be of sufficient quality to each have a field of view equal to the longest dimension on the reticle, ie. the hypotenuse of approximately fourteen cm, at the required level of resolution and uniformity. Additionally, the imager optics must demagnify the reticle image ten times to create patterns having 1 micron or smaller feature size on the slice. Optics having sufficient quality to meet these requirements are very complex and thus form a significant part of the cost of a conventional stepper.

Often the individual chips being patterned on the slice 28 are wider than the permissible field of view of the apparatus 10. When the chip size is larger than the field of view, it is often necessary to create a mosaic of reticles to form the desired pattern at the chip level through the process of reticle composition. A mosaic increases the number of reticles required for each layer of patterns and requires special care to ensure continuity between each reticle making up the mosaic, both of which increase the time and cost of fabricating the integrated circuit.

After patterning, wafer 28 is removed for developing and subsequent processing steps, after which wafer 28, is returned to the device 10 for generation of subsequent layers of patterns. Each layer of patterns requires a separate reticle or mosaic of reticles which must be installed into the device 10. Through operator error, the reticle may occasionally be damaged or installed incorrectly which will destroy the desired pattern on wafer 28. The invention disclosed herein prevents these and other difficulties encountered with the prior art devices.

Figure 2:
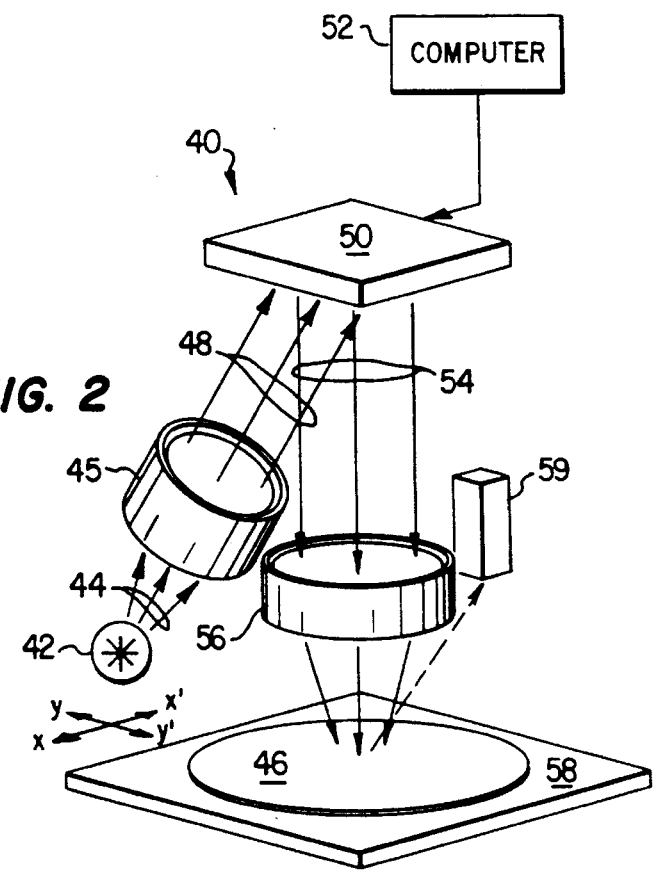
FIG. 2 is a perspective view of an apparatus for patterning an imaging member in accordance with the present invention.

Referring to FIG. 2, an apparatus for patterning an imaging member constructed in accordance with the present invention is generally identified by the reference numeral 40. The device 40 comprises a light source 42, for example, infrared, ultraviolet or x-rays, capable of emitting light rays, as indicated by arrows 44, having appropriate wave length to pattern an imaging member 46. The light 44 emitted from light source 42 passes through an optical device such as collimator 45 to redirect the light as indicated by arrows 48. Collected light 48 strikes a spatial light modulator (SLM) 50. SLM 50 is positioned planar to the imaging member 46 and at a predetermined angle with respect to the light source 42. SLM 50 comprises a plurality of mirror devices or pixels, not shown, which will be subsequently described in more detail. A digital computer 52 is interconnected to SLM 50 to program the pixels as required.

Light, as indicated by arrows 54, is reflected from SLM 50 when selected pixel elements are actuated toward an optical imager 56. The optical imager 56 demagnifies the reflected light 54 to the proper dimensions for patterning the imaging member 46. The imaging member 46 comprises, for example, a semiconductor substrate coated with a photopolymer such as photoresist or a packaged semiconductor chip device encased in an ablatable or photothermal plastic. A transporting device 58 supports and carries imaging member 46 in the required fashion. If imaging member 46 is a semiconductor wafer, device 58 will comprise a platform for precise two dimensional movement of the slice as indicated by arrows X-X' and Y-Y'. If imaging member 46 is a packaged semiconductor device, transporting device 58 may comprise a conveyor.

In the preferred embodiment, light source 42 comprises an ultraviolet light and imaging member 46 comprises a semiconductor wafer coated with photoresist. Device 58 comprises a stepper type platform capable of precise two dimensional X-X' and Y-Y' movements to move the wafer 28 in a linear or section-by-section motion.

In accordance with the preferred embodiment of the present invention, a digital computer is utilized to individually control the pixels on the SLM. As will be subsequently described in greater detail, each pixel is electronically positioned into an on position, which will reflect light to the imaging member, or into an off position, which will not reflect light to the imaging member. By individually controlling each pixel, it is possible to create any pattern desired on the imaging member. Thus, it is possible to eliminate the need for unique multiple reticles as required in the prior art.

One of the problems inherent with prior art devices was the time consuming reticle realignment process before patterning subsequent layers onto an imaging member. In the prior art, it was necessary for an operator or optical processor to physically align marks on the imaging member with a pattern on a monitor screen. Alignment was accomplished when the marks were positioned with respect to the screen pattern.

On modern steppers, this is accomplished by computer in the following manner. Laser light from a separate source is positioned on an optical diffraction grating previously patterned into the wafer during a prior process step. When the wafer is properly aligned, the signal from the diffracted laser light is maximized. This method is accurate, but require pre-alignment of the slice to position the laser light on the prescribed optical pattern on the wafer. It assumes that the laser system and the reticle projection system are properly registered. If the wafer is moved to a different stepper for later process steps, proper registration of respective layers may be impaired due to stepper to stepper variations. This method is thus susceptible to error, and is dependent on a precise optical grating pattern on the wafer that may, in some process steps, be affected by subsequent processing or material layers.

An advantage of the present invention is that by virtue of the dynamic program ability of the SLM, a through-the-lens alignment of the wafer can be accomplished that eliminates the need for a separate alignment system, and guarantees registration of the light modulating member (SLM) to the imaging member regardless of intervening factors. This is accomplished by selectively activating elements of the SLM under computer control to modulate light onto the regions of the wafer known to contain alignment key patterns. Separate pixel elements on the SLM chip could be incorporated for this purpose, or a separate light source of a wavelength chosen to not expose the photoresist could be used. When the wafer and the SLM chip were correctly registered, the return signal detected by light pattern detector 59 would give a suitable indication. By using the exposing element (SLM) to locate the imaging member 46 (wafer) misregistration, tolerances could be controlled in a highly reliable manner.

An additional benefit in the present invention is the ability to pattern photoresist on an imaging member in a vacuum. In the prior art, it was impractical to use an evacuated environment due to the necessity to change reticles. In the present invention, reticle interchange is eliminated by the SLM which may therefore be installed in an evacuated optical system. Thus inorganic photoresist which is developable by short wave length light such as I-line and excimer laser ultraviolet and x-rays may be used to pattern a semiconductor surface in a vacuum. It was not practical, prior to the present invention, to use short wavelength light due to the attenuating influence of air in an unevacuated system. As is well known in the art, inorganic photoresist developed with short wave length light provides superior pattern resolution.

Figure 3:
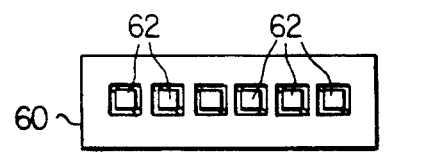
FIG. 3 is a plan view of a spatial light modulator with a linear array.

Referring to FIG. 3, a spatial light modulator 60 arranged in a linear array is shown in plan view. The linear array comprises a plurality of pixels 62 each approximately fifteen microns square, only a portion shown for ease of illustration. The number of pixels 62 may vary from 1,000 to over 2,400 per inch, depending upon the use of the device. Each pixel 62 is configured to allow movement by electrostatic control as will be described subsequently in more detail. Since each of the pixels 62 can be independently controlled between on and off conditions, the SLM is capable of assuming a wide variety of reflective configurations.

Figure 4:
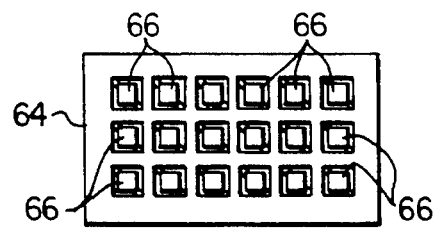
FIG. 4 is a plan view of a spatial light modulator in an area array.

FIG. 4 illustrates an example of an SLM 64 configured in an area array. The number of individual pixels 66 varies depending upon the use of the SLM 64. The pixels 66 are constructed in the same fashion as those in a linear array as will be subsequently described in more detail.

Figure 5A:
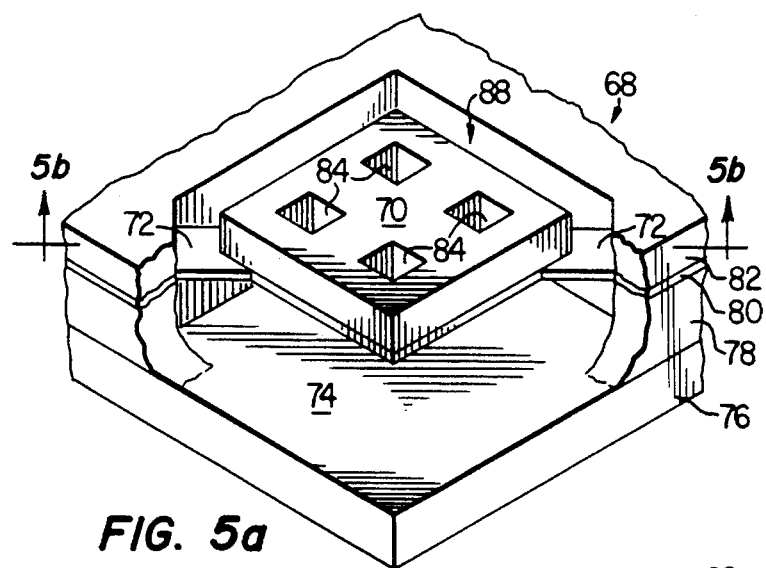
FIG. 5a is a cut-away perspective of a pixel.

In FIG. 5a, a partially cut-away perspective of a pixel 68 is illustrated. A pixel of the type used herein is disclosed in Hornbeck U.S. Pat. No. 4,662,746, May 5, 1987, to Hornbeck, as typically used with an electrophotographic printing machine, and is incorporated herein by reference. The pixel 68, clearly shown as mirror 70, is electrostatically positioned into an on position or an off position by an electronic controller.

The mirror 70 covers a shallow well 74 which is typically formed over a silicon substrate 76 which contains addressing logic. Substrate 76 is coated with a layer 78 of sacrificial material which acts as an insulator. A hinge layer 80 comprising an aluminum/titanium/silicon (Al/Ti/Si) alloy is formed over the layer 78. The hinge layer 80 forms the torsion hinges 72 about which mirror 70 pivots. A final beam layer 82 comprising the same Al/Ti/Si alloy as layer 78 is formed over layer 78. The layer 78 and the beam layer 82 are separately applied layers of the same material to minimize stress which could cause warping or curling of the hinges 72 on the mirror 70.

Plasma etch access holes 84 are provided through mirror 70 to allow etching of the sacrificial spacer layer 78 under the mirror 70 to form the well 74. A plasma etch access gap 88 formed to define the perimeter of mirror 70 also assists with the etching of layer 78 and allows mirror 70 to pivot about hinges 72.

Figure 5B:
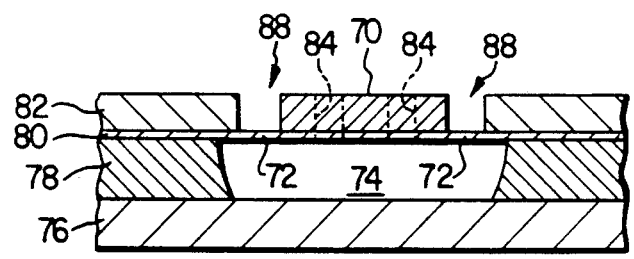

Referring to FIG. 5b, the pixel 68 is illustrated in cross-section approximately along line 5b of FIG. 5a. Pixel 68 can thus be seen to comprise consecutive layers. Silicon substrate layer 76 is coated with sacrificial spacer layer 78. Layer 78 is coated with a relatively thin layer of aluminum/titanium/silicon alloy to form hinge layer 80 which is then covered by a relatively thick layer of the same aluminum/titanium/silicon alloy to form beam layer 82. After the etching processes well 74 and gap 88 are formed.

Typical dimensions for pixel 68 would be as follows: mirror 70 is fifteen microns square, layer 78 is four microns thick, hinge layer 80 is eight hundred Angstroms thick, beam layer 82 is thirty-six hundred Angstroms thick, access holes 84 are two microns square, plasma etch access gap 86 is two microns wide and hinges 72 are three microns long and two microns wide.

Silicon substrate 76 typically has addressing circuitry, not shown, formed on its surface. Pixel 68 is operated by applying a voltage between metal layers 80–82 and address electrodes on substrate 76. Mirror 70 and the exposed surface of substrate 76 form the two plates of an air gap capacitor and the opposite charges induced on the two plates by an applied voltage exert an electrostatic force attracting mirror 70 to substrate 76. This attractive force causes mirror 70 to bend at hinges 72 towards substrate 76. In effect, this gives mirror 70 the capability of an on position or an off position which may be electronically controlled by a computer.

Thus, in a linear array as shown on FIG. 3, the SLM will reflect a line of light corresponding to each pixel in an on position. By signalling individual pixels to be on or off, any variation of a straight line may be produced on an imaging member. In the area array of FIG. 4, by turning the pixels on or off, an area image may be formed. In both the linear and area arrays, it is possible to form any desired image on an imaging member by programming a computer to control the SLM.

Figure 6:
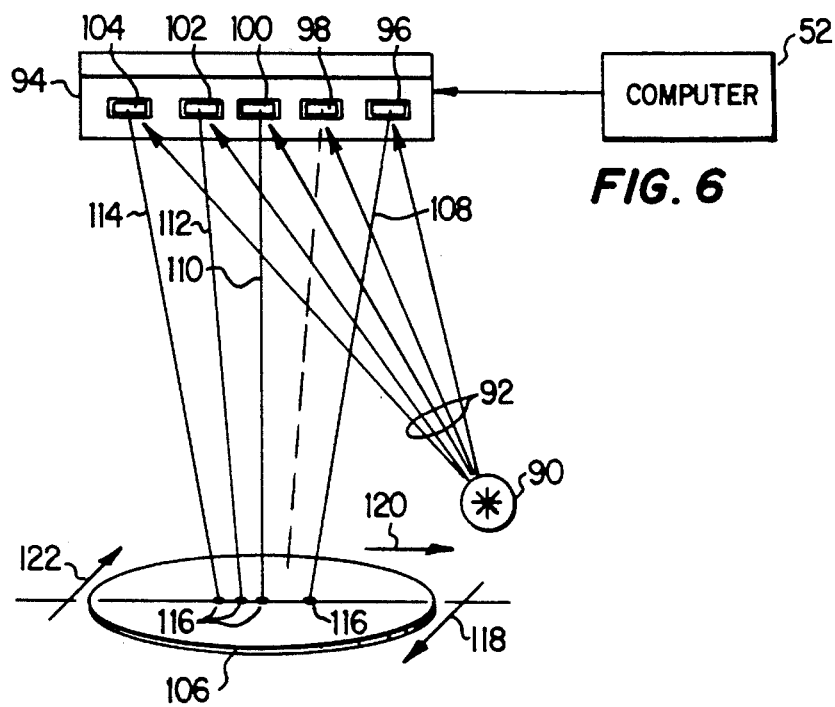
FIG. 6 is a side view of a simplified illustration of a raster.

Referring to FIG. 6, the effects of light reflected from a spatial light modulator onto an imaging member to form a raster line is shown in greatly simplified form. A light source 90 emits light beams 92 onto a spatial light modulator 94. Individual pixels 96, 98, 100, 102 and 104 are preprogrammed by an electronic controller 52 to be in the on or off position. In the on position, light from light source 90 is reflected toward imaging member 106 as shown by line 108 from pixel 96, line 110 from pixel 100, line 112 from pixel 102 and line 114 from pixel 104. When light strikes imaging member 106 an image is formed thereon as indicated by dots 116. A pixel in the off position, as indicated by pixel 98, will not reflect light towards the imaging member 106 and, therefore, no image will be formed thereon. In actual practice, there could be from 1,000 to over 2,400 individual pixels to form images on the imaging member.

In operation with a linear array of pixels, a linear shaped image or raster will be formed on imaging member 106. As imaging member 106 is moved, the linear images formed by the SLM 94 may be continuously revised by electronically addressing the pixels with the electronic controller. The electronic controller turns the individual pixels on if an image is to be formed and off if no image is to be formed. By continuously revising the SLM 94 electronically, a line of any length up to and including the entire width of imaging member 106 may be created. Therefore, the desired pattern may be created by either of two methods for moving the imaging member 106.

In the preferred method, the imaging member 106 would be moved in a direction 118 perpendicular to the raster formed by SLM 94. The entire width of the SLM 94 is patterned in one continuous pass and the member 106 is then stepped in a direction 120 parallel to the raster a necessary distance to position the next pattern. The member 106 is again translated in a direction 122 perpendicular to the raster and so on until the entire pattern is transferred to the member 106.

Alternatively, an area array spatial light modulator would create an area image which can be reprogrammed to form the next area image while the imaging member is stepped an appropriate distance in a manner analogous to the operation of the wafer stepper using a conventional reticle pattern.

Although the present invention has been described with respect to a specific preferred embodiment thereof, various changes and modifications may be suggested to one skilled in the art and it is intended that the present invention encompasses such changes and modifications as fall within the scope of the appended claims.

What is claimed is:

1. A method for patterning an imaging member having an organic photoresist layer, comprising the steps of:

emitting light from a source, said light having a short wavelength suitable to expose said organic photoresist layer on said imaging member and to render said organic photoresist layer sensitive to development;

optically focusing said light onto an array of positionable mirror devices;

positioning selected ones of said mirror devices in response to an electrical signal to provide a pattern reflected therefrom; and optically imaging said reflected pattern onto the imaging member to form a pattern of reacted organic photoresist in said organic photoresist layer.

2. The method of claim 1, wherein the step of positioning said mirror devices comprises generating an electrical signal from an electronic controller to pivot said mirror devices, each to an on position or an off position.

3. The method of claim 1, said method further comprising the step of positioning selected other ones of said mirror devices in response to an alignment signal and monitoring a return signal of reflected light, said return signal indicating the degree of misregistration of the imaging member with respect to said array of mirror devices.

4. A method for manufacturing a semiconductor device, comprising the steps of:

creating a digitized model of an integrated circuit;

programming a spatial light modulator corresponding to said model;

optically focusing light from a light source onto said modulator;

reflecting said light from said modulator corresponding to said model through an optical imager; and passing a photoresist coated semiconductor wafer past said optical imager to transfer said model to said wafer to form the semiconductor device.

5. The method of claim 4, wherein the step of programming comprises electronically controlling said modulator with a computer.

6. The method of claim 5, wherein the step of electronically controlling further comprises electrostatically attracting a hinged mirror about said hinge to a silicon substrate to position said mirror to reflect light onto said semiconductor wafer or to reflect light away from said semiconductor wafer.

7. A method for patterning an imaging member having a layer of photosensitive material comprising the steps of:

selecting a frequency band from the group consisting of the ultraviolet, x-ray, and infrared bands;

emitting light having a frequency within said selected frequency band from a source;

optically focusing said light onto an array of electronically programmable mirrors;

programming said mirrors and rotating them to an on position or an off position to provide a selected one of a plurality of patterns which may be reflected therefrom; and optically imaging said reflected pattern onto the imaging member to form a pattern of reacted photosensitive material in said layer of photosensitive material.

8. The method of claim 7 wherein said emitted light is ultraviolet (UV).

9. The method of claim 7 wherein said emitted light is infrared.

10. The method of claim 7 wherein said imaging member is a integrated circuit chip.

11. The method of claim 7 wherein said imaging member contains photothermal plastic.

12. A method of patterning a semiconductor substrate, said method comprising the steps of:

providing a digitized model of an integrated circuit;

forming a layer of photoresist on a semiconductor substrate;

emitting light from a source;

optically focusing said light onto an array of electrostatically positionable mirror devices;

electrostatically positioning selected ones of said mirror devices in response to an electrical signal;

generating said electrical signal, said electrical signal dependent upon said digitized model such that the positioning of said mirror devices corresponds to said digitized model; and optically imaging said reflected pattern onto the semiconductor substrate to form a pattern of reacted photoresist in said layer of photoresist.

13. The method of claim 12 wherein at least one of the steps occurs in an evacuated environment.

14. The method of claim 13 wherein said light source provides a short wavelength light.

15. The method of claim 14 wherein said photoresist is an inorganic photoresist.

16. The method of claim 14 wherein said light source is the I-line of a light source.

17. The method of claim 14 wherein said light source is an ultraviolet excimer laser.

18. The method of claim 12 and further comprising the step of electrostatically positioning selected other ones of said mirror devices in response to an alignment signal and monitoring a return signal of reflected light which would indicate the degree of misregistration of the semi-conductor substrate with respect to said array of electrostatically positionable mirror devices.

19. The method of claim 12 wherein the light emitted from said source has a frequency selected from the group consisting of the ultraviolet, x-ray, and infrared frequency bands.

\* \* \* \* \*